United States Patent
Park et al.

(10) Patent No.: US 7,829,931 B2
(45) Date of Patent: Nov. 9, 2010

(54) NONVOLATILE MEMORY DEVICES HAVING CONTROL ELECTRODES CONFIGURED TO INHIBIT PARASITIC COUPLING CAPACITANCE

(75) Inventors: Bong-Tae Park, Seoul (KR); Jeong-Hyuk Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/670,526

(22) Filed: Feb. 2, 2007

(65) Prior Publication Data

US 2008/0093653 A1 Apr. 24, 2008

(30) Foreign Application Priority Data

Oct. 19, 2006 (KR) ...................... 10-2006-0101966

(51) Int. Cl.
*H01L 27/105* (2006.01)
(52) U.S. Cl. ............................... 257/315; 257/E27.081
(58) Field of Classification Search ......... 257/315–319, 257/E21.68, E21.681, E27.081
See application file for complete search history.

(56) References Cited

U.S. PATENT DOCUMENTS

| | | | | |
|---|---|---|---|---|
| 6,403,421 | B1 * | 6/2002 | Ikeda et al. ................. | 438/267 |
| 6,743,695 | B2 * | 6/2004 | Lee et al. .................... | 438/439 |
| 6,884,679 | B2 * | 4/2005 | Park et al. ................... | 438/257 |
| 2005/0047261 | A1 * | 3/2005 | Kai et al. .................... | 365/232 |
| 2005/0139900 | A1 * | 6/2005 | Jung et al. .................. | 257/319 |
| 2005/0285179 | A1 * | 12/2005 | Violette ...................... | 257/315 |
| 2006/0128099 | A1 | 6/2006 | Kim et al. | |
| 2006/0246666 | A1 * | 11/2006 | Han et al. ................... | 438/263 |

FOREIGN PATENT DOCUMENTS

| | | |
|---|---|---|
| JP | 07-235590 | 9/1995 |
| JP | 2003-303907 | 10/2003 |
| JP | 2004-022819 | 1/2004 |
| JP | 2004-273643 | 9/2004 |
| JP | 17-079165 A | 3/2005 |
| KR | 102000003452 | 6/2000 |
| KR | 1020050002304 A | 1/2005 |
| KR | 1020060075442 A | 4/2006 |
| KR | 1020060067058 A | 6/2006 |

* cited by examiner

*Primary Examiner*—Lynne A Gurley
*Assistant Examiner*—Colleen A Matthews
(74) *Attorney, Agent, or Firm*—Myers Bigel Sibley & Sajovec

(57) ABSTRACT

Non-volatile memory devices include a substrate with first and second semiconductor active regions therein. These active regions are separated from each other by a trench isolation region, which has a recess therein that extends along its length. First and second floating gate electrodes are provided. These first and second floating gate electrodes extend on the first and second semiconductor active regions, respectively. A control electrode is provided that extends between the first and second floating gate electrodes and into the recess in the trench isolation region. The recess in the trench isolation region is sufficiently deep so that the control electrode, which extends into the recess, operates to reduce (e.g., block) a parasitic coupling capacitance between the first and second floating gate electrodes.

2 Claims, 11 Drawing Sheets

NONVOLATILE MEMORY DEVICES HAVING CONTROL ELECTRODES CONFIGURED TO INHIBIT PARASITIC COUPLING CAPACITANCE

REFERENCE TO PRIORITY APPLICATION

This U.S. non-provisional patent application claims priority under 35 U.S.C. §119 to Korean Patent Application No. 2006-101966, filed Oct. 19, 2006, the entire contents of which are hereby incorporated herein by reference.

FIELD OF THE INVENTION

The present invention relates to memory devices and methods of forming same and, more particularly, to non-volatile memory devices and methods of forming non-volatile memory devices.

BACKGROUND OF THE INVENTION

Semiconductor memory devices are generally classified as volatile memory devices and nonvolatile memory devices. Volatile memory devices lose stored data when power is turned off, but nonvolatile memory devices retain stored data even after power is turned off. Flash memory devices, like general nonvolatile memory devices, can be classified into a floating gate type and a charge trap type, depending on the kinds of data storage layers constituting a unit cell.

FIG. 1 is a partial schematic perspective view of a floating gate type flash memory device, illustrating a relationship between a floating gate voltage (Vfg) and parasitic capacitances ($C_{FGA}$, $C_{FGW}$). Referring to FIG. 1, a tunnel oxide layer 17, a floating gate 19, an inter-gate insulating layer 27 and a control gate 29 are sequentially formed over an active region 9 to thereby define a device isolation layer 13 formed on a semiconductor substrate 1. Here, the inter-gate insulating layer 27 may be formed as an oxide-nitride-oxide (ONO) layer. The active region 9 extends in a first direction (DA), which is a bitline direction, and the control gate 29 extends in a second direction (DW), which is a word line direction. An interlayer insulating layer 27 is interposed between the floating gates 19, as illustrated.

Reference symbols V and C illustrated in FIG. 1 show voltage and capacitance references. $V_{FG}$ denotes a voltage of the floating gate disposed in a central position (hereinafter, the central floating gate) among nine floating gates. $V_A$ denotes voltages of the floating gates adjacent in the first direction (DA) with respect to the central floating gate, and $V_W$ denotes voltage of the floating gate adjacent in the second direction (DW) with respect to the central floating gate. $C_{FGA}$ denotes a parasitic capacitance caused between the floating gates adjacent in the first direction (DA), and $C_{FGW}$ denotes a parasitic capacitance caused between the floating gates adjacent in the second direction (DW). As understood by those skilled in the art, the parasitic capacitances increase as the high integration of the memory devices is increased. As a distance between the active region 9 and an inter-gate insulating layer 27 is shortened, charges in the active region 9 may be trapped in the inter-gate insulating layer 27 and cause malfunction of a memory cell. Therefore, reliability and operational characteristics of the memory device may be degraded.

SUMMARY OF THE INVENTION

Embodiments of the present invention include non-volatile memory devices that are configured to have reduced parasitic capacitance between floating gate electrodes. According to some of these embodiments, a non-volatile memory device is provided having a substrate with first and second semiconductor active regions therein. These active regions are separated from each other by a trench isolation region, which has a recess therein that extends along its length. First and second floating gate electrodes are also provided. These first and second floating gate electrodes extend on the first and second semiconductor active regions, respectively. A control electrode is provided that extends between the sidewalls of the first and second floating gate electrodes and into the recess in the trench isolation region. In particular, the recess in the trench isolation region is sufficiently deep so that the control electrode, which extends into the recess, operates to reduce (e.g., block) a parasitic coupling capacitance between the sidewalls of the first and second floating gate electrodes. For example, the recess may be sufficiently deep so that a first portion of the trench isolation region extends between a first sidewall of the control electrode (in the recess) and a sidewall of the first floating gate electrode and a second portion of the trench isolation region extends between a second sidewall of the control electrode (in the recess) and a sidewall of the second floating gate electrode.

According to aspects of these embodiments, a first sidewall of the trench isolation region defines an interface with a first sidewall of the first floating gate electrode and a width of the first floating gate electrode is tapered to be narrower at its top relative to its bottom. According to additional aspects of these embodiments, a width of the first floating gate electrode is greater than a width of the first semiconductor active region.

According to additional embodiments of the invention, a non-volatile memory device is provided with a semiconductor substrate having a trench therein that is at least partially filled with an electrically insulating trench isolation region. The trench isolation region has a trench-shaped recess therein that extends along its length. A first floating gate electrode extends on a first portion of the semiconductor substrate extending adjacent the trench isolation region and a control electrode is provided that extends in the trench-shaped recess and on the first floating gate electrode. A second floating gate electrode is also provided on a second portion of the semiconductor substrate, which extends adjacent the trench isolation region. According to aspects of these embodiments, the first and second floating gate electrodes have opposing sidewalls and a center of the trench-shaped recess is located about equidistant from the opposing sidewalls.

Still further embodiments of the present invention include methods of forming non-volatile memory devices. Some of these methods include forming first and second trench isolation regions at side-by-side locations in a semiconductor substrate to thereby define a semiconductor active region therebetween. A floating gate electrode is formed on an upper surface of the semiconductor active region and an electrically insulating layer is formed on sidewalls and an upper surface of the floating gate electrode. The electrically insulating layer is etched back to define sidewall insulating spacers on sidewalls of the floating gate electrode. The upper surfaces of the first and second trench isolation regions are selectively etched-back to define trench-shaped recesses therein. This etching step is performed using the sidewall insulating spacers as an etching mask. These methods also include removing the sidewall insulating spacers to expose the sidewalls of the floating gate electrode and etching back the sidewalls of the floating gate electrode for a sufficient duration so that the floating gate electrode is tapered to be narrower at its top relative to its bottom. Alternative methods may also include removing the sidewall insulating spacers to expose the sidewalls of the floating gate electrode and lining the trench-shaped recesses with an inter-gate dielectric layer. The trench-shaped recesses are filled with portions of a control electrode, which operates to block parasitic capacitance (in the word line direction) between adjacent floating gate electrodes.

Still further embodiments of the invention include forming a mask pattern on a surface of a semiconductor substrate and selectively etching the surface of the semiconductor substrate to thereby define first and second trenches at side-by-side locations in the semiconductor substrate, using the mask pattern as an etching mask. The first and second trenches and openings in the mask pattern are then filled with first and second trench isolation regions, respectively. The mask pattern is removed to expose sidewalls of the first and second trench isolation regions. The exposed sidewalls of the first and second trench isolation regions are then recessed. First and second floating gate electrodes are formed against the recessed sidewalls of the first and second trench isolation regions, respectively. The upper surfaces of the first and second trench isolation regions are etched-back to expose sidewalls of the first and second floating gate electrodes. An electrically insulating layer is formed on the exposed sidewalls and upper surfaces of the first and second floating gate electrodes. The electrically insulating layer is then etched back to define sidewall insulating spacers on sidewalls of the first and second floating gate electrodes. Upper surfaces of the first and second trench isolation regions are then selectively etched to define trench-shaped recesses therein. This etching step uses the sidewall insulating spacers as an etching mask. According to some additional embodiments of the invention, the sidewall insulating spacers are removed to expose the sidewalls of the floating gate electrode and the sidewalls of the floating gate electrode are etched back for a sufficient duration so that the floating gate electrode is tapered to be narrower at its top relative to its bottom.

DETAILED DESCRIPTION OF PREFERRED EMBODIMENTS

Figure 1:
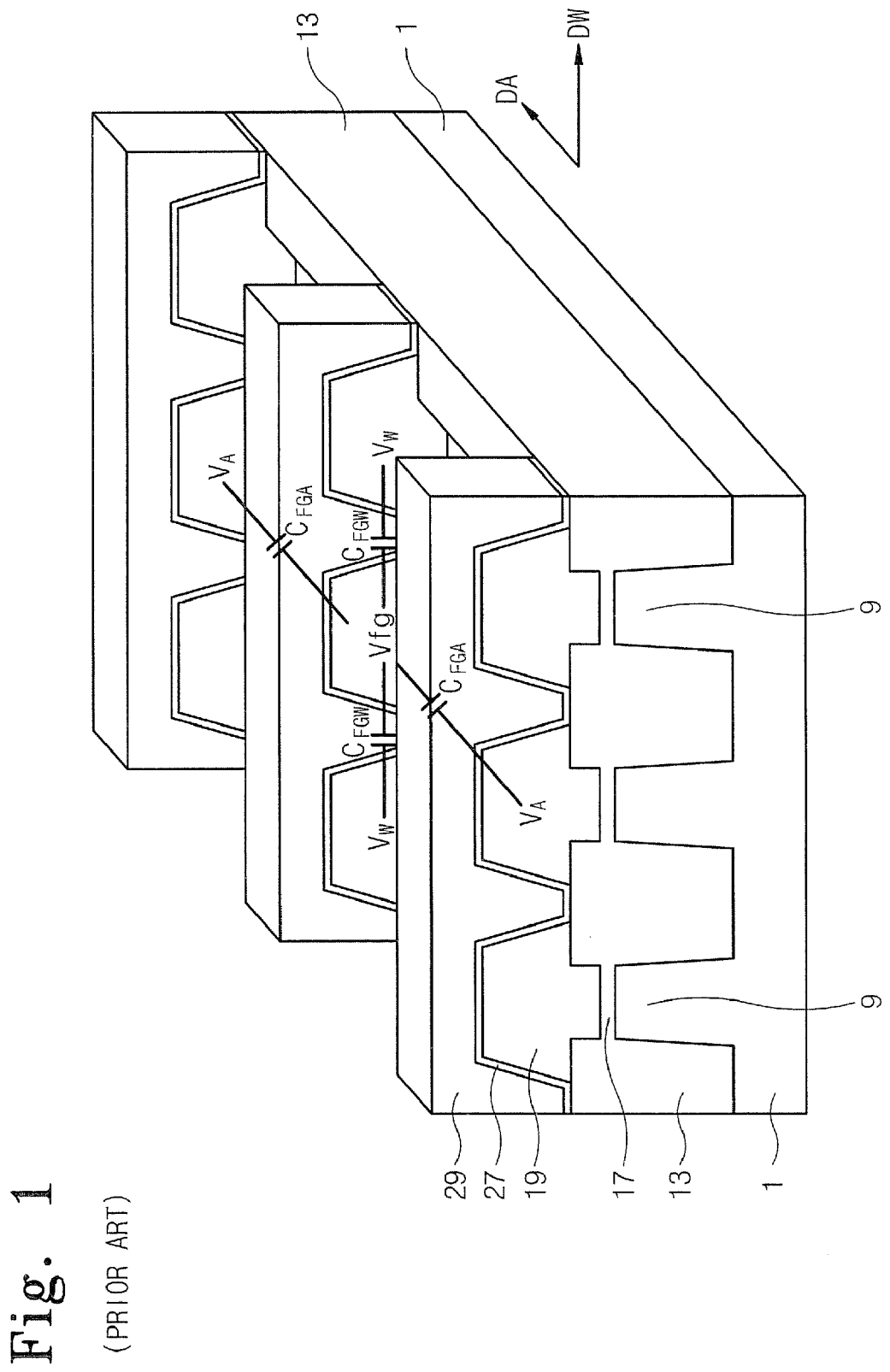
FIG. 1 is a perspective view of a non-volatile memory device having an array of floating gate electrodes therein that are capacitively coupled together in a word line direction (DW) and a bit line direction (DA).

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

It will be understood that, although the terms first, second and the like may be used herein to describe various regions, layers, and the like, these regions, layers, and the likes should not be limited by these terms. These terms are only used to distinguish one region, layer, and the like from another region, layer, and the like. It will also be understood that when a layer is referred to as being "on" another layer or substrate, it can be directly on the other layer or substrate, or a third layer between intervening layers may also be present. In the drawings, the thicknesses of layers and regions may be exaggerated for clarity.

Figure 2:
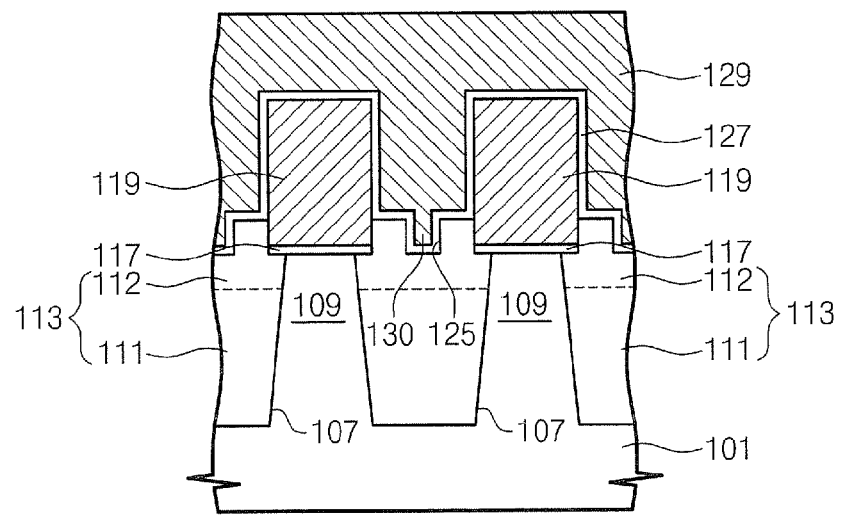
FIG. 2 is a cross-sectional view of a non-volatile memory device according to an embodiment of the present invention.

FIG. 2 is a cross-sectional view of a nonvolatile memory device according to an embodiment of the present invention, taken along a word line direction. Referring to FIG. 2, a device isolation layer 113 in a semiconductor substrate 101 defines active regions 109 of the device. This device isolation layer 113 is illustrated as including a plurality of trench isolation regions that fill respective trenches 107. A gate insulating layer 117 and a floating gate electrode 119 are formed on the active region 109. A width of the floating gate 119 may be greater than an upper surface of the active region 109. The gate insulating layer 117 may be formed as a tunnel oxide layer.

The device isolation layer 113 may include a lower insulating pattern 111 and an upper insulating pattern 112. The lower insulating pattern 111 and the upper insulating pattern 112 may be formed of materials having different electrical, chemical or other physical characteristics. For example, the lower insulating pattern 111 may include a material having excellent gap-filling performance and the upper insulating pattern 112 may include a material that is highly resistant to wet etching using an etchant such as phosphoric acid and/or hydrofluoric acid.

The upper insulating pattern 112 includes a recess region 125 disposed between the floating gates 119. As illustrated, the upper insulating pattern 112 is interposed between sidewalls of the recess region 125 and the floating gate 119 (or gate insulating layer 117). A bottom surface of the upper insulating pattern 112 may be lower than that of the gate insulating layer 117 and a bottom surface of the recess region 125 may be lower than that of the floating gates 119.

An inter-gate insulating layer 127 is disposed along both sidewalls and the bottom surface of the recess region 125, an upper surface of the upper insulating pattern 112, and sidewalls and upper surfaces of the floating gates 119. A word line 129 crosses over the active regions 109 and extends on the inter-gate insulating layer 127. The word line 129 extends downward between the floating gates 119. A protrusion portion 130 of the word line 129 is inserted into the recess region 125 of the upper insulating pattern 112. A bottom surface of the protrusion portion 130 may be lower than that of the floating gate 119. The word line 129 functions as a control electrode with respect to the floating gate 119.

This protrusion portion 130 of the word line 129 operates to reduce a parasitic coupling capacitance between adjacent floating gate electrodes 119 by blocking direct capacitive coupling between opposing sidewalls of adjacent floating gate electrodes 119.

Furthermore, increased lifetime of the non-volatile memory device can be achieved by providing portions of the insulating pattern 112 between the recess 125 and the active regions 109. These portions of the insulating pattern 112 operate to block parasitic charge transfer from the active regions 109 to the inter-gate insulating layer 127 during repeated program and erase operations.

Figure 3:
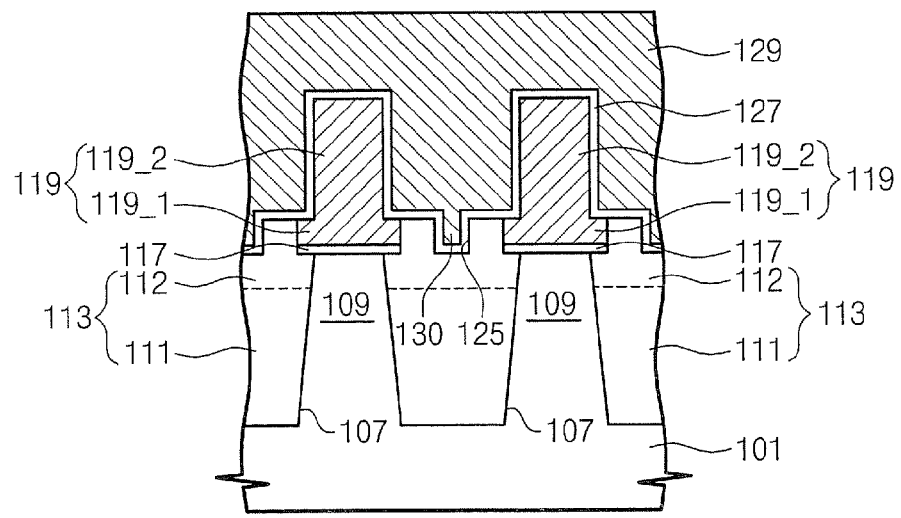
FIG. 3 is a cross-sectional view of a non-volatile memory device according to an embodiment of the present invention.

Referring now to FIG. 3, a nonvolatile memory device according to an additional embodiment of the present invention is illustrated as being similar to the embodiment of FIG. 2, however, the shape of the floating gate electrode 119 is modified to include a lower conductive pattern 119_1 and an upper conductive pattern 119_2. As illustrated by FIG. 3, a width of the lower conductive pattern 119_1 is greater than a width of the active region 109 and greater than a width of the upper conductive pattern 119_2. To sustain high performance device characteristics, a width of the upper conductive pattern 119_2 is in a range from about 0.5 times to about 0.7 times a width of the lower conductive pattern 119_1. By forming the upper conductive patterns 119_2 to be narrower patterns, the parasitic gate-to-gate capacitance between adjacent floating gate electrodes 119 can be reduced without significantly reducing the inter-gate coupling between each floating gate electrode 119 and an overlapping word line/control gate 129.

Figure 4:
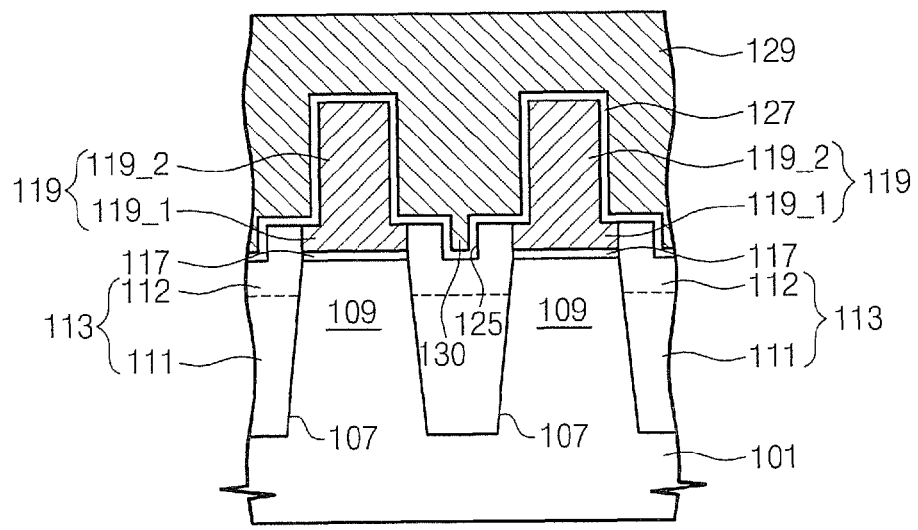
FIG. 4 is a cross-sectional view of a non-volatile memory device according to an embodiment of the present invention.

Referring now to FIG. 4, a nonvolatile memory device according to an additional embodiment of the present invention is illustrated as similar to the embodiment of FIG. 3, however, a lower conductive pattern 119_1 is illustrated as having an equivalent width to the active region 109. Moreover, the sidewalls of the active region 109 are self-aligned to the sidewalls of the lower conductive pattern 119_1. This self-alignment is achieved using the fabrication techniques illustrated by FIGS. 16-20, which are described more fully hereinbelow.

Figure 5:
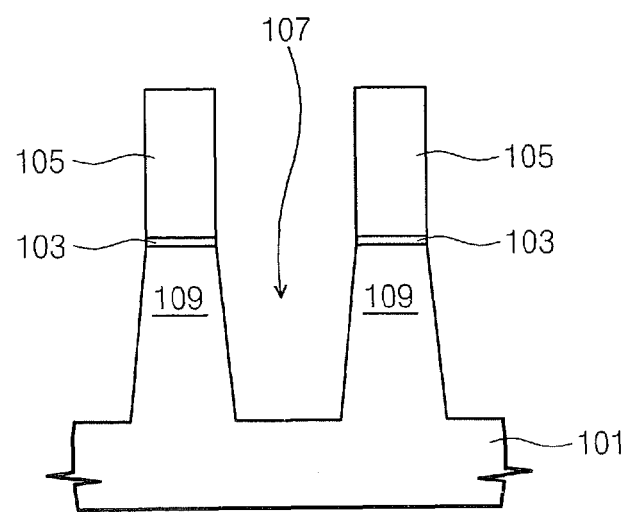
FIGS. 5-11 are cross-sectional views of intermediate structures that illustrate additional methods of forming the non-volatile memory device of FIG. 2.

Methods of forming the nonvolatile memory device of FIG. 2 will now be described more fully with reference to FIGS. 5-11. In particular, FIG. 5 illustrates the steps of forming a pad oxide layer and a mask layer on a semiconductor substrate 101 and then photolithographically patterning these layers to define a pad oxide pattern 103 and a mask pattern 105. The pad oxide layer may be formed as a thermal oxide layer, which operates to inhibit interface stress at a surface of the semiconductor substrate 101. The mask layer may be formed as a polysilicon layer, an antireflective coating layer, a silicon nitride layer or a composite of these layers, for example. An etching step is then performed to define a plurality of isolation trenches 107 in the substrate 101. These trenches 107 may be stripe-shaped trenches that extend in a third dimension (not shown). This etching step, which is preferably performed using the pad oxide pattern 103 and the mask pattern 105 as an etching mask, also results in the definition of a plurality of active regions 109 having expose sidewalls.

Figure 6:
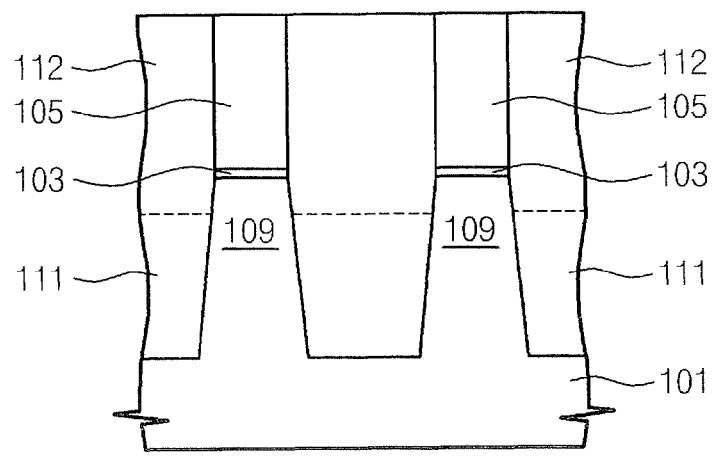

Referring now to FIG. 6, lower and upper electrically insulating patterns 111 and 112 are then deposited, in sequence, in the trenches 107. These lower insulating patterns 111 may be formed of a material having good gap-filling characteristics (i.e., low tendency to void formation) and the upper insulating patterns 112 may be formed of a material that is highly resistant to etching (e.g., wet etching). Such etching steps may include exposing the upper insulating patterns 112 to a wet etchant such as phosphoric acid or hydrofluoric acid. The lower insulating patterns 111 may be formed by filling the isolation trenches 107 with an undoped silicate glass (USG) layer and then recessing (e.g., etching back) the USG layer to thereby define the lower insulating patterns 112. A high density plasma (HDP) oxide layer may then be deposited on the lower insulating patterns 111 and then planarized for a sufficient duration to expose upper surfaces of the mask pattern 105, and thereby define the upper insulating patterns 112.

Figure 7:
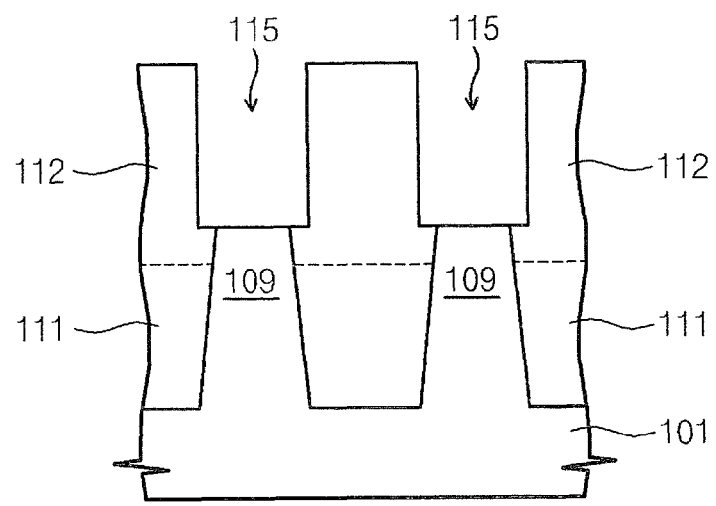
Figure 8:
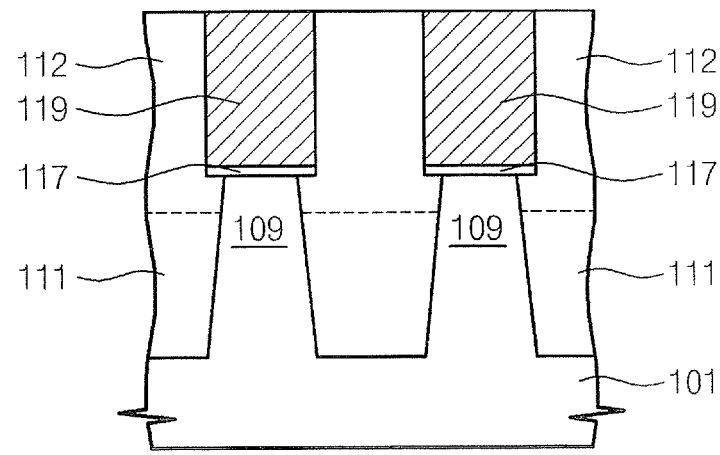

Referring now to FIG. 7, an etching process is performed to remove the mask pattern 105 and the pad oxide pattern 103 in sequence and thereby define a plurality of gap regions 115 that expose upper surfaces of the active regions 109. As illustrated, this etching process may result in the lateral etching of the upper insulating patterns 112, which means the gap regions 115 may have a larger width than the upper surfaces of the active regions 109. Thereafter, as illustrated by FIG. 8, a plurality of gate insulating layers 117 (e.g., tunnel oxide layers) and a plurality of floating gate electrodes 119 are formed in the gap regions 115. These gate insulating layers 117 may be formed by performing a thermal oxidation process on the exposed upper surfaces of the active regions 109. The floating gate electrodes 119 may be formed by depositing a polysilicon layer into the gap regions 115 and then planarizing the polysilicon layer to expose the upper insulating patterns 112.

Figure 9:
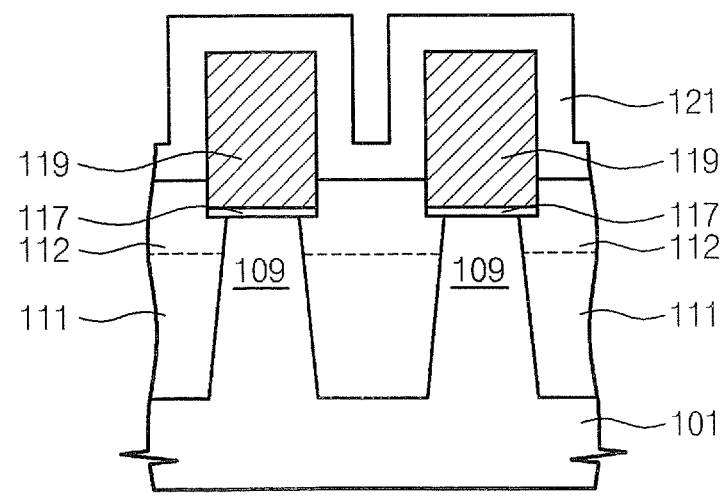

As illustrated by FIG. 9, an etching step is then performed to etch-back the upper insulating patterns 112 so that upper sidewalls of the floating gate electrodes 119 are exposed. A molding insulating layer 121 is then conformally deposited on the upper surfaces and sidewalls of the floating gate electrodes 119 and on upper surfaces of recessed upper insulating patterns 112. The molding insulating layer 121 may be formed of a material having an etching selectively with respect to the upper insulating patterns 112. For example, the molding insulating layer 121 may be formed of a nitride layer or an oxide layer that is more susceptible to a wet etchant relative to the upper insulating patterns 112.

Figure 10:
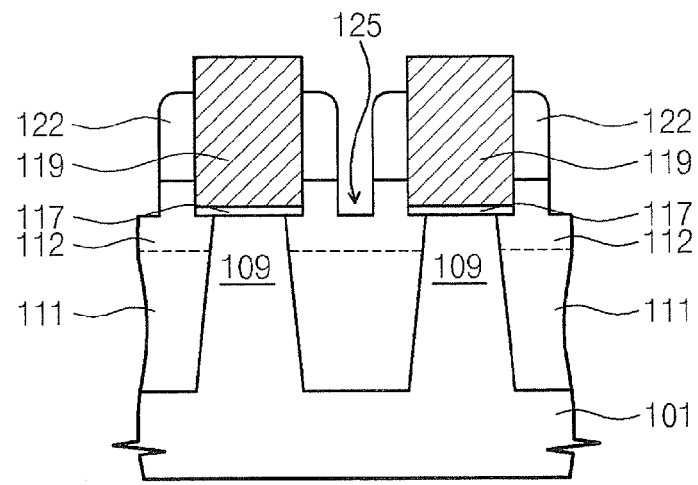
Figure 11:
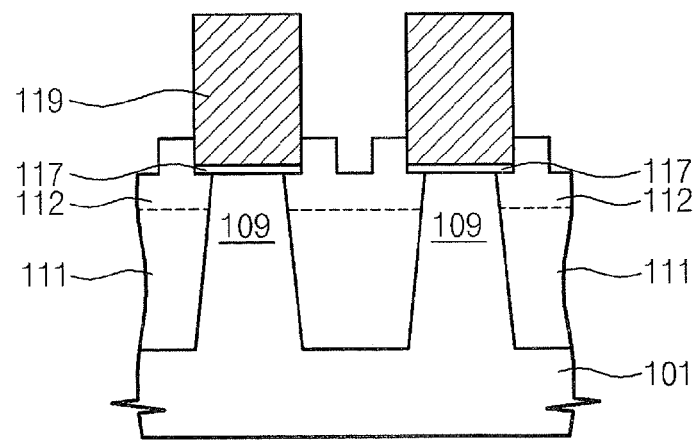

Referring now to FIGS. 10-11, the molding insulating layer 121 of FIG. 9 is anisotropically etched to define a plurality of molding spacers 122 that cover portions of the sidewalls of the floating gate electrodes 119. The definition of these molding spacers 122 also results in the exposure of the upper insulating patterns 112. These exposed portions of the upper insulating patterns 112 are then etched using the molding spacers 122 as an etching mask. This etching results in the formation of recesses 125 in upper portions of the upper insulating patterns 112. As illustrated, these recesses 125 may have bottoms that are below the lower surfaces of the floating gate electrodes 119. The molding spacers 122 are then removed (at least partially) using an etching process that exposes the sidewalls of the floating gate electrodes 119. This etching process is preferably performed using an etchant (e.g., isotropic wet etchant) that does not significantly etch sidewalls of the recesses 125 in the upper portions of the upper insulating patterns 112. For example, in the event the molding spacers 122 are formed of a nitride layer, the etching process can include an etchant containing phosphoric acid and the upper insulating patterns 112 can include a material that is relatively resistant to phosphoric acid. However, in the event the molding spacers 122 are formed of an oxide layer, the etching process can include an etchant containing hydrofluoric acid and the upper insulating patterns 112 can include a material that is relatively resistant to hydrofluoric acid.

Referring again to FIG. 2, an inter-gate insulating layer 127 is then conformally deposited on the intermediate structure of FIG. 11. As illustrated, this inter-gate insulating layer 127 is deposited on the floating gate electrodes 119 (upper surfaces and sidewalls) and the tipper insulating patterns 112. This inter-gate insulating layer 127 also extends into the recesses 125, as illustrated. The inter-gate insulating layer 127 may be formed as a composite of an oxide layer/nitride layer/oxide layer (i.e., ONO layer). A conductive layer is then deposited on the inter-gate insulating layer 127 and patterned to define a word line/control gate pattern 129. This patterning of the word line/control gate pattern 129 may include patterning the floating gate pattern 119 into a plurality of floating gate electrodes 119 having dimensions that are self-aligned to the word line/control gate pattern 129. As illustrated, the word line/control gate pattern 129 extends downward between the floating gates 119. In particular, protruding portions 130 of the word line/control gate pattern 129 extend into the recesses 125. The word line/control gate pattern 129 may be formed as a polysilicon layer, a metal layer and/or a silicide layer.

Figure 12:
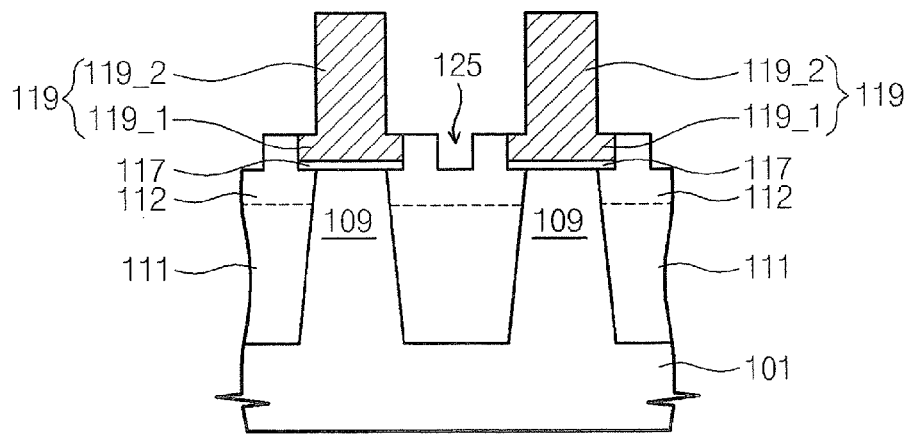
FIG. 12 is a cross-sectional view of an intermediate structure that illustrates fabrication steps associated with the manufacture of the non-volatile memory device of FIG. 3.
Figure 13:
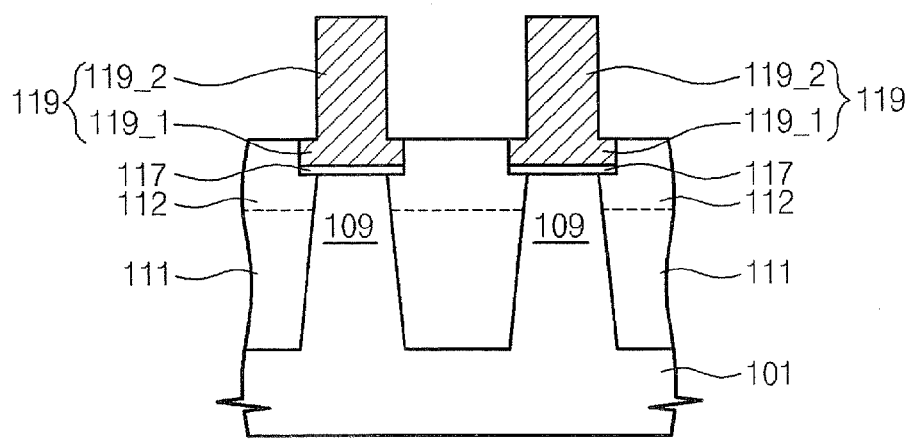
FIGS. 13-15 are cross-sectional views of intermediate structures that illustrate additional methods of forming the non-volatile memory device of FIG. 3.

Alternatively, as illustrated by FIG. 12, the exposed sidewalls of the floating gate patterns 119 of FIG. 11 may be etched-back using an isotropic wet etching process. This etching process results in the formation of a floating gate pattern 119 having a lower conductive pattern 119_1 and an upper conductive pattern 119_2 having different widths. This etching process may include using an etchant (e.g., wet etchant) that does not appreciably etch the upper insulating patterns 112 or the sidewalls of the recesses 125. Thereafter, as illustrated by FIG. 3, an inter-gate insulating layer 127 is conformally deposited on the intermediate structure of FIG. 12. As illustrated, this inter-gate insulating layer 127 is deposited on the floating gate pattern 119 (upper surfaces and sidewalls) and the upper insulating patterns 112. This inter-gate insulating layer 127 also extends into the recesses 125, as illustrated. The inter-gate insulating layer 127 may be formed as a composite of an oxide layer/nitride layer/oxide layer (i.e., ONO layer). A conductive layer is then deposited on the inter-gate insulating layer 127 and patterned to define a word line/control gate pattern 129. This patterning of the word line/control gate pattern 129 includes patterning the floating gate pattern 119 into a plurality of floating gate electrodes 119 having dimensions that are self-aligned to the word line/control gate pattern 129. As illustrated, the word line/control gate pattern 129 extends downward between the floating gates 119. In particular, protruding portions 130 of the word line/control gate pattern 129 extend into the recesses 125. The word line/control gate pattern 129 may be formed as a polysilicon layer, a metal layer and/or silicide layer.

Figure 14:
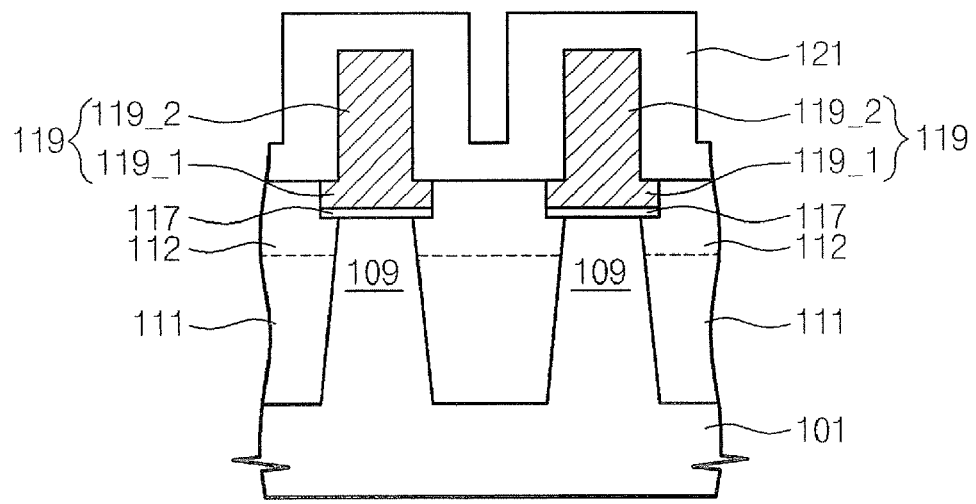
Figure 15:
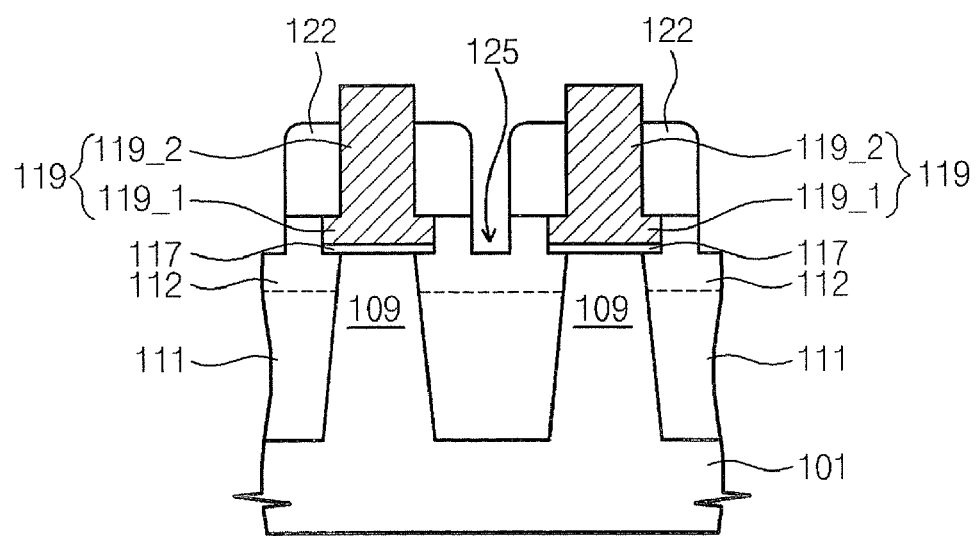

Referring now to FIGS. 8 and 13-15, an alternative embodiment of a method of forming the device of FIG. 3 may include selectively etching back the upper insulating patterns 112 to expose sidewalls of the floating gate pattern 119 and then selectively etching the sidewalls of the floating gate pattern to define the lower conductive pattern 119_1 and the narrower upper conductive pattern 119_2. Thereafter, as illustrated by FIGS. 14-15, a molding insulating layer 121 is then conformally deposited on the upper surfaces and sidewalls of the upper conductive pattern 119_2 and on upper surfaces of recessed upper insulating patterns 112. The molding insulating layer 121 may be formed of a material having an etching selectively with respect to the upper insulating patterns 112. For example, the molding insulating layer 121 may be formed of a nitride layer or an oxide layer that is more susceptible to a wet etchant relative to the upper insulating patterns 112. Thereafter, as illustrated by FIG. 15, the molding insulating layer 121 is anisotropically etched to define a plurality of molding spacers 122 that cover portions of the sidewalls of the floating gate electrodes 119. The definition of these molding spacers 122 also results in the exposure of the upper insulating patterns 112. These exposed portions of the upper insulating patterns 112 are then etched using the molding spacers 122 as an etching mask. This etching results in the formation of recesses 125 in upper portions of the upper insulating patterns 112. As illustrated, these recesses 125 may have bottoms that are below the lower surfaces of the floating gate electrodes 119. The molding spacers 122 are then removed (at least partially) using an etching process that exposes the sidewalls of the floating gate electrodes 119. This removal of the molding spacers 122 results in the definition of the intermediate structure of FIG. 12, which can be further processed as illustrated by FIG. 3.

Figure 16:
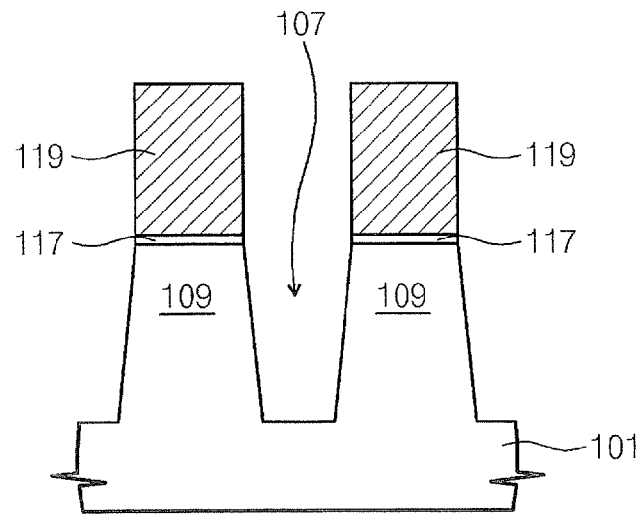
FIGS. 16-20 are cross-sectional views of intermediate structures that illustrate methods of forming the non-volatile memory device of FIG. 4.
Figure 17:
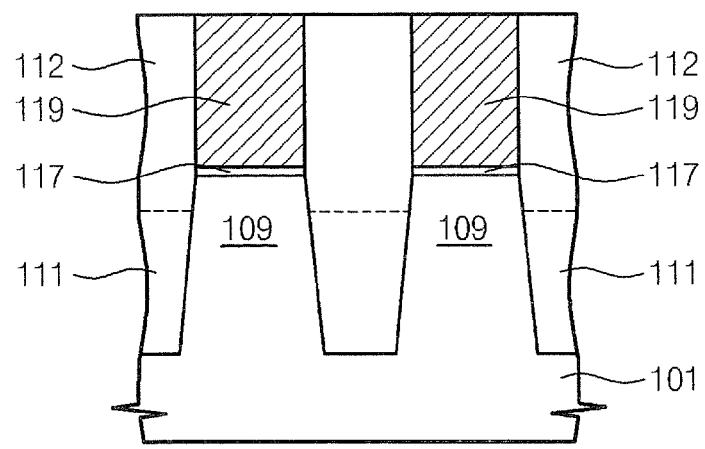

FIGS. 16-20 are cross-sectional views of intermediate strictures that illustrate methods of forming the non-volatile memory device of FIG. 4. As illustrated by FIG. 16, a gate insulating layer 117 and a floating gate pattern 119 are formed in sequence on a semiconductor substrate 101. The floating gate pattern 119 is then used as etch mask to define a plurality of trenches 107 (e.g., stripe-shaped trenches) within the semiconductor substrate 101. These trenches 107 define a plurality of semiconductor active regions therebetween, which extend opposite corresponding portions of the floating gate pattern 119. By using the floating gate pattern 119 as an etching mask to define a plurality of trenches 107, the active regions become self-aligned to the floating gate pattern 119. Referring now to FIG. 17, a lower insulating pattern 111 is formed within lower portions of the trenches 107 and an upper insulating pattern 112 is formed on the lower insulating pattern 111, as illustrated. The lower insulating pattern 111 may be formed of a material having good gap-filling characteristics (i.e., low tendency to void formation) and the upper insulating pattern 112 may be formed of a material that is highly resistant to etching (e.g., wet etching), as previously described. An undoped silicate glass (USG) layer may be used for the lower insulating pattern 111 and a high-density plasma (HDP) oxide layer may be used for the floating gate pattern 119.

Figure 18:
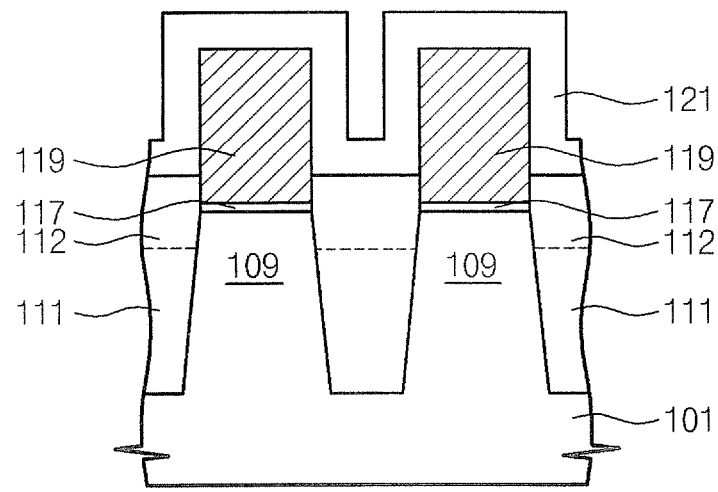

Referring now to FIG. 18, an etching process is performed on the intermediate structure of FIG. 17 in order to etch-back the upper insulating layer 112 and expose upper sidewalls of the floating gate pattern 119. A molding insulating layer 121 is then conformally deposited on the exposed upper sidewalls and upper surfaces of the floating gate pattern 119. The molding insulating layer 121 may be formed of a material having an etch selectivity with respect to the upper insulating pattern 112. For example, the molding insulating layer 121 may be formed as a nitride layer or an oxide layer, depending on the material of the upper insulating pattern 112.

Figure 19:
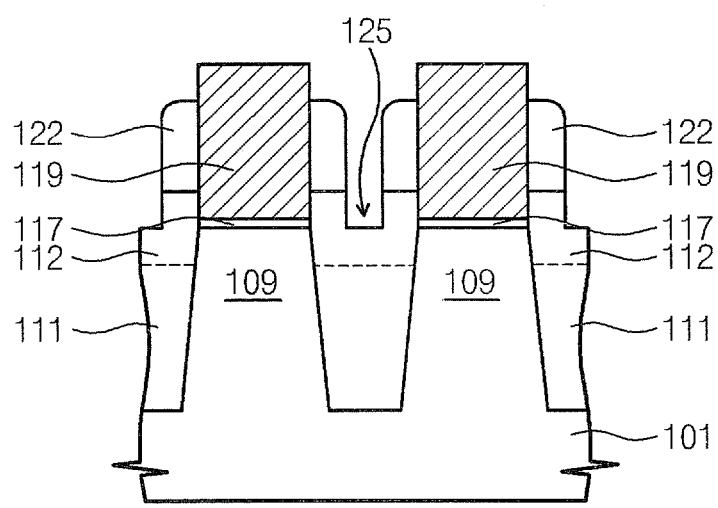

An anisotropic etching step is then performed on the molding insulating layer 121. This etching step is performed for a sufficient duration to thereby define molding spacers 122 on sidewalls of the floating gate pattern 119, as illustrated by FIG. 19. These molding spacers 122 are then used as an etching mask to selectively etch back exposed portions of the upper insulating pattern 112. This selective etching of the upper insulating pattern 112 results in the formation of recesses 125 within the upper surfaces of the upper insulating pattern 112, which are self-aligned to the molding spacers 122. As illustrated, these recesses 125 may have bottoms that are lower than the underside surfaces of the floating gate pattern 119, which interface with the gate insulating layer 117.

Figure 20:
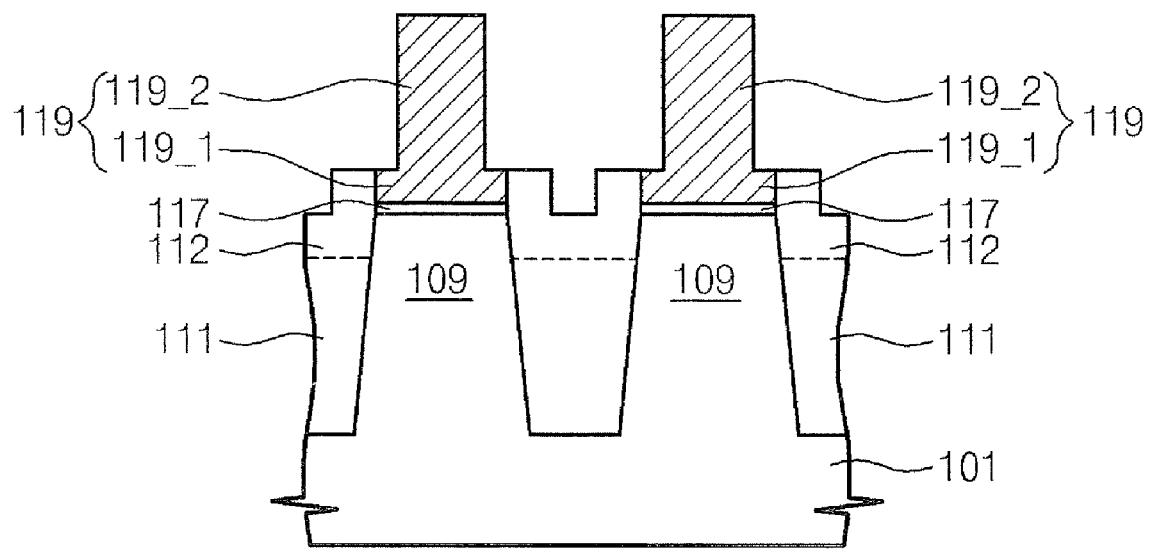

Referring now to FIG. 20, an etching process is performed on the intermediate structure of FIG. 19 to thereby remove the molding spacers 122 and expose sidewalls of the floating gate pattern 119. This etching process (e.g., isotropic wet etching) is performed using an etchant that may selectively remove the molding spacers 122 and not substantially etch the upper insulating pattern 112 or widen the recesses 125. For example, when the molding spacers 122 are formed of a nitride layer, the wet etching process can use an etchant containing phosphoric acid. Alternatively, when the molding spacers 122 are formed of an oxide layer, the wet etching process can use an etchant containing hydrofluoric acid.

Thereafter, as illustrated by FIG. 4, an inter-gate insulating layer 127 is conformally deposited on the intermediate structure of FIG. 20. This inter-gate insulating layer 127 is deposited on the floating gate pattern 119 (upper surfaces and sidewalls) and the upper insulating patterns 112. This inter-gate insulating layer 127 also extends into the recesses 125, as illustrated. The inter-gate insulating layer 127 may be formed as a composite of an oxide layer/nitride layer/oxide layer (i.e., ONO layer). A conductive layer is then deposited on the inter-gate insulating layer 127 and patterned to define a word line/control gate pattern 129. This patterning of the word line/control gate pattern 129 includes patterning the floating gate pattern 119 into a plurality of floating gate electrodes 119 having dimensions that are self-aligned to the word line/control gate pattern 129. As illustrated, the word line/control gate pattern 129 extends downward between the floating gates 119. In particular, protruding portions 130 of the word line/control gate pattern 129 extend into the recesses 125. The word line/control gate pattern 129 may be formed as a poly-silicon layer, a metal layer and/or silicide layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A non-volatile memory device, comprising:
a substrate having first and second semiconductor active regions therein that are separated from each other by a trench isolation region within a trench, said trench isolation region having a recess therein that extends along its length and comprising a lower insulating pattern of a first electrically insulating material, and an upper insulating pattern of a second electrically insulating material that is different than the first electrically insulating material, on the lower insulating pattern;

first and second floating gate electrodes extending on the first and second semiconductor active regions, respectively, each of said first and second floating gate electrodes comprising a lower conductive pattern and a upper conductive pattern on the lower conductive pattern;

a control electrode that extends between said first and second floating gate electrodes and into the recess in said trench isolation region; and an inter-gate insulating layer extends between said control electrode, and said first and second floating gate electrodes, wherein a width of the lower conductive pattern of said first floating gate electrode is greater than a width of the upper conductive pattern of said first floating gate electrode, wherein top surfaces of the lower conductive pattern disposed at both sides of the upper conductive pattern are in contact with the inter-gate insulating layer.

2. The non-volatile memory device of claim 1, wherein a sidewall of the lower conductive pattern directly connected to one edge of the top surface of the lower conductive pattern is in contact with said trench isolation region.

* * * * *